(12) United States Patent
Choi

(10) Patent No.: US 11,106,237 B2
(45) Date of Patent: Aug. 31, 2021

(54) SHIFT REGISTERS

(71) Applicant: SK hynix Inc., Icheon-si (KR)

(72) Inventor: Geun Ho Choi, Icheon-si (KR)

(73) Assignee: SK hynix Inc., Icheon-si (KR)

( * ) Notice: Subject to any disclaimer, the term of this patent is extended or adjusted under 35 U.S.C. 154(b) by 0 days.

(21) Appl. No.: 16/514,666

(22) Filed: Jul. 17, 2019

(65) Prior Publication Data

US 2020/0285269 A1 Sep. 10, 2020

(30) Foreign Application Priority Data

Mar. 5, 2019 (KR) .................. 10-2019-0025321

(51) Int. Cl.
| | | |
|---|---|---|
| *G11C 19/00* | (2006.01) | |
| *G06F 1/12* | (2006.01) | |
| *G06F 1/08* | (2006.01) | |
| *G06F 5/06* | (2006.01) | |
| *G11C 19/28* | (2006.01) | |

(52) U.S. Cl.
CPC .................. *G06F 1/12* (2013.01); *G06F 1/08* (2013.01); *G06F 5/06* (2013.01); *G11C 19/28* (2013.01); *G11C 19/287* (2013.01); *G09G 2310/0286* (2013.01)

(58) Field of Classification Search
None
See application file for complete search history.

(56) References Cited

U.S. PATENT DOCUMENTS

| | | | | |
|---|---|---|---|---|
| 5,341,031 A | * | 8/1994 | Kinoshita | .......... H03K 5/15066 |
| | | | | 327/115 |
| 7,210,052 B2 | * | 4/2007 | Lee | .......... G06F 1/12 |
| | | | | 375/356 |
| 8,072,253 B2 | | 12/2011 | Kaeriyama et al. | |
| 8,963,603 B2 | * | 2/2015 | Huang | .............. H03K 5/15013 |
| | | | | 327/291 |
| 9,304,532 B2 | * | 4/2016 | Jung | .......... G06F 1/12 |
| 10,193,539 B1 | * | 1/2019 | Choi | .......... H03K 21/10 |
| 10,372,157 B2 | * | 8/2019 | Lee | .......... G11C 7/222 |
| 10,795,401 B2 | * | 10/2020 | Jang | .......... G06F 1/12 |
| 2011/0001535 A1 | * | 1/2011 | Iyer | .......... H03K 3/0375 |
| | | | | 327/202 |
| 2012/0194246 A1 | * | 8/2012 | Hirairi | .......... G11C 19/00 |
| | | | | 327/198 |

(Continued)

FOREIGN PATENT DOCUMENTS

KR   100635500 B1   10/2006

*Primary Examiner* — Tuan T Lam
(74) *Attorney, Agent, or Firm* — William Park & Associates Ltd.

(57) ABSTRACT

A shift register includes a latch clock generation circuit and a clock latch circuit. The latch clock generation circuit generates a latch clock signal and an inverted latch clock signal based on a first internal clock signal, a first inverted internal clock signal, a second internal clock signal, and a second inverted internal clock signal. The clock latch circuit latches a control signal in synchronization with one signal selected from the first internal clock signal, the first inverted internal clock signal, the second internal clock signal, and the second inverted internal clock signal. The clock latch circuit also latches the latched control signal in synchronization with the latch clock signal or the inverted latch clock signal to generate and output a shift control signal.

20 Claims, 10 Drawing Sheets

(56) References Cited

U.S. PATENT DOCUMENTS

| | | | |
|---|---|---|---|
| 2017/0200485 A1* | 7/2017 | Choi | G11C 7/1087 |
| 2019/0333553 A1* | 10/2019 | Choi | G11C 7/222 |
| 2020/0099378 A1* | 3/2020 | Kumar | H03K 19/00315 |
| 2020/0105322 A1* | 4/2020 | Choi | G11C 7/1054 |

* cited by examiner

12

SHIFT REGISTERS

CROSS-REFERENCE TO RELATED APPLICATIONS

The present application claims priority under 35 U.S.C 119(a) to Korean Application No. 10-2019-0025321, filed on Mar. 5, 2019, which is incorporated herein by reference in its entirety.

BACKGROUND

1. Technical Field

Embodiments of the present disclosure generally relate to shift registers and, more particularly, to shift registers operating with multiphase internal clock signals.

2. Related Art

A shift register may be used to control an execution sequence of various operations performed in an electronic circuit by shifting a control signal by a relatively short period or a relatively long period in synchronization with a clock signal. Recently, a shift register operating with multiphase internal clock signals has been used in various electronic circuits to improve an operation speed of the electronic circuits.

SUMMARY

According to an embodiment, a shift register may include a latch clock generation circuit and a clock latch circuit. The latch clock generation circuit may be configured to generate a latch clock signal and an inverted latch clock signal based on a first internal clock signal, a first inverted internal clock signal, a second internal clock signal, and a second inverted internal clock signal. The clock latch circuit may be configured to latch a control signal in synchronization with one signal selected from the first internal clock signal, the first inverted internal clock signal, the second internal clock signal, and the second inverted internal clock signal. The clock latch circuit may be configured to latch the latched control signal in synchronization with the latch clock signal or the inverted latch clock signal to generate and output a shift control signal.

According to an embodiment, a shift register may include a latch clock generation circuit, a first clock latch, and a second clock latch. The latch clock generation circuit may be configured to generate a latch clock signal and an inverted latch clock signal based on a first internal clock signal, a first inverted internal clock signal, a second internal clock signal, and a second inverted internal clock signal. The first clock latch may be configured to be synchronized with an edge of the first internal clock signal to latch a control signal. The second clock latch may be configured to latch an output signal of the first clock latch in synchronization with an edge of the latch clock signal to generate a shift control signal.

According to an embodiment, a shift register may include a latch clock generation circuit, a first clock latch, and a second clock latch. The latch clock generation circuit may be configured to generate a latch clock signal and an inverted latch clock signal based on a first internal clock signal, a first inverted internal clock signal, a second internal clock signal, and a second inverted internal clock signal. The first clock latch may be configured to be synchronized with an edge of the first internal clock signal to latch a control signal. The second clock latch may be configured to latch an output signal of the first clock latch in synchronization with an edge of the inverted latch clock signal to generate a shift control signal.

DETAILED DESCRIPTION

Various embodiments of the present disclosure will be described hereinafter with reference to the accompanying drawings. However, the embodiments described herein are for illustrative purposes only and are not intended to limit the scope of the present disclosure.

While terms such as "first" and "second" may be used to describe various components, such components must not be understood as being limited to the above terms. The above terms are used only to distinguish one component from another. For example, a first component may be referred to as a second component without departing from the scope of rights of the present disclosure, and likewise a second component may be referred to as a first component.

Figure 1:
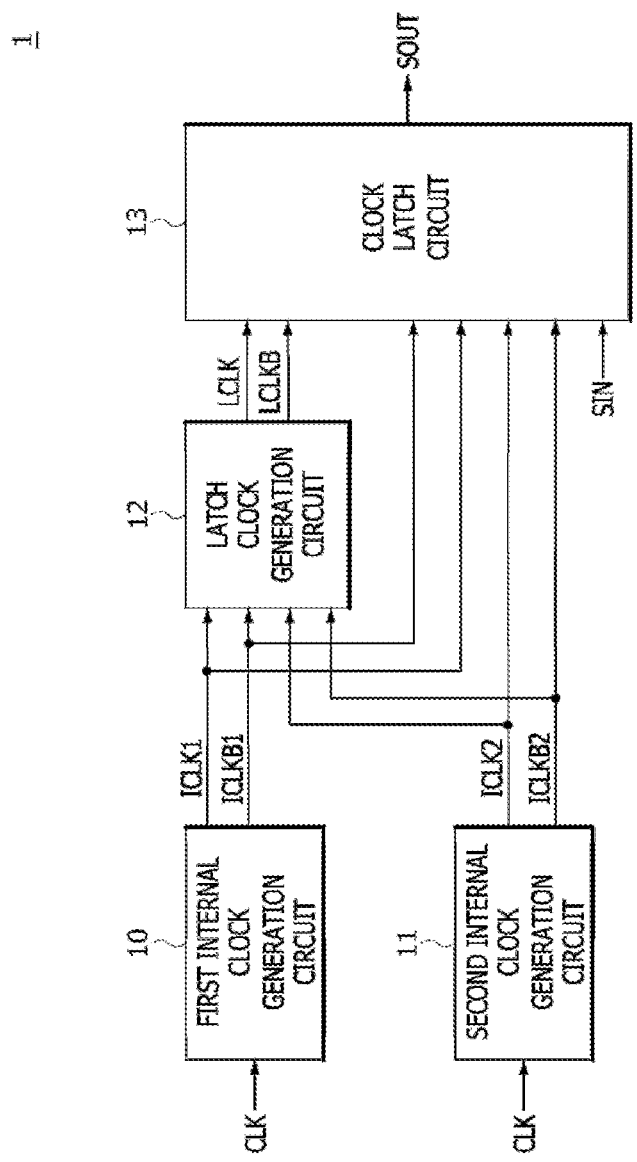
FIG. 1 is a block diagram illustrating a configuration of a shift register according to an embodiment of the present disclosure.

As illustrated in FIG. 1, a shift register 1 according to an embodiment may include a first internal clock generation circuit 10, a second internal clock generation circuit 11, a latch clock generation circuit 12, and a clock latch circuit 13.

The first internal clock generation circuit 10 may generate a first internal clock signal ICLK1 and a first inverted internal clock signal ICLKB1 from a clock signal CLK. The first internal clock generation circuit 10 may divide a frequency of the clock signal CLK to generate the first internal clock signal ICLK1 and the first inverted internal clock signal ICLKB1. The first internal clock signal ICLK1 may be generated to be a 2-division signal having a cycle which is twice a cycle of the clock signal CLK. The first inverted internal clock signal ICLKB1 may be generated by inverting the first internal clock signal ICLK1.

The second internal clock generation circuit 11 may generate a second internal clock signal ICLK2 and a second inverted internal clock signal ICLKB2 from the clock signal CLK. The second internal clock generation circuit 11 may divide a frequency of the clock signal CLK to generate the second internal clock signal ICLK2 and the second inverted internal clock signal ICLKB2. The second internal clock signal ICLK2 may be generated to be a 2-division signal having a cycle which is twice a cycle of the clock signal CLK. The second inverted internal clock signal ICLKB2 may be generated by inverting the second internal clock signal ICLK2.

The latch clock generation circuit 12 may generate a latch clock signal LCLK and an inverted latch clock signal LCLKB based on the first internal clock signal ICLK1, the first inverted internal clock signal ICLKB1, the second internal clock signal ICLK2, and the second inverted internal clock signal ICLKB2. The latch clock generation circuit 12 may generate the inverted latch clock signal LCLKB based on the first internal clock signal ICLK1 and the second internal clock signal ICLK2. The latch clock generation circuit 12 may generate the inverted latch clock signal LCLKB having a second logic level when at least one of the first internal clock signal ICLK1 and the second internal clock signal ICLK2 has a first logic level. The latch clock generation circuit 12 may generate the latch clock signal LCLK based on the first inverted internal clock signal ICLKB1 and the second inverted internal clock signal ICLKB2. The latch clock generation circuit 12 may generate the latch clock signal LCLK having the second logic level when at least one of the first inverted internal clock signal ICLKB1 and the second inverted internal clock signal ICLKB2 has the first logic level. In an embodiment, the first logic level may be set as a logic "low" level, and the second logic level may be set as a logic "high" level. In some other embodiments, the first logic level may be set as a logic "high" level, and the second logic level may be set as a logic "low" level. In other embodiments, different characteristics of a signal, such as frequency or amplitude, determine whether the signal has a high level or a low level. A configuration and an operation of the latch clock generation circuit 12 will be described below with reference to FIG. 2 later.

The clock latch circuit 13 may generate a shift control signal SOUT from a control signal SIN based on the first internal clock signal ICLK1, the first inverted internal clock signal ICLKB1, the second internal clock signal ICLK2, the second inverted internal clock signal ICLKB2, the latch clock signal LCLK, and the inverted latch clock signal LCLKB. The clock latch circuit 13 may latch the control signal SIN in synchronization with any one selected from the first internal clock signal ICLK1, the first inverted internal clock signal ICLKB1, the second internal clock signal ICLK2, and the second inverted internal clock signal ICLKB2 and may re-latch the latched signal of the control signal SIN in synchronization with any one selected from the latch clock signal LCLK and the inverted latch clock signal LCLKB to generate the shift control signal SOUT.

The clock latch circuit 13 may re-latch the latched signal of the control signal SIN in synchronization with the latch clock signal LCLK to generate the shift control signal SOUT after latching the control signal SIN in synchronization with the first internal clock signal ICLK1 or the second internal clock signal ICLK2. In such a case, the shift control signal SOUT may be generated by shifting the control signal SIN in synchronization with a first edge of the first internal clock signal ICLK1 or the second internal clock signal ICLK2. The first edge may be defined as a rising edge at which a logic level transition occurs from a logic "low" level into a logic "high" level.

The clock latch circuit 13 may re-latch the latched signal of the control signal SIN in synchronization with the inverted latch clock signal LCLKB to generate the shift control signal SOUT after latching the control signal SIN in synchronization with the first internal clock signal ICLK1 or the second internal clock signal ICLK2. In such a case, the shift control signal SOUT may be generated by shifting the control signal SIN in synchronization with a second edge of the first internal clock signal ICLK1 or the second internal clock signal ICLK2. The second edge may be defined as a falling edge at which a logic level transition occurs from a logic "high" level into a logic "low" level.

The clock latch circuit 13 may re-latch the latched signal of the control signal SIN in synchronization with the inverted latch clock signal LCLKB to generate the shift control signal SOUT after latching the control signal SIN in synchronization with the first inverted internal clock signal ICLKB1 or the second inverted internal clock signal ICLKB2. In such a case, the shift control signal SOUT may be generated by shifting the control signal SIN in synchronization with the first edge of the first inverted internal clock signal ICLKB1 or the second inverted internal clock signal ICLKB2. A configuration and an operation of the clock latch circuit 13 will be described below with reference to FIGS. 3 to 10 later.

Figure 2:
FIG. 2 is a circuit diagram illustrating an example of a latch clock generation circuit included in the shift register of FIG. 1.
Figure 2:
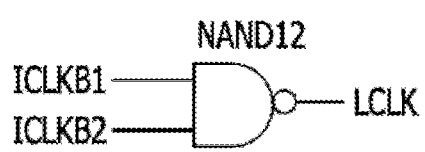

Referring to FIG. 2, the latch clock generation circuit 12 may be configured to perform NAND logic operations and may include, for example but not limited to, a NAND gate NAND11 and a NAND gate NAND12. The NAND gate NAND11 may receive the first internal clock signal ICLK1 and the second internal clock signal ICLK2 and may perform a logical NAND operation of the first internal clock signal ICLK1 and the second internal clock signal ICLK2 to generate the inverted latch clock signal LCLKB. The NAND gate NAND11 may generate the inverted latch clock signal LCLKB having a logic "high" level when at least one of the first internal clock signal ICLK1 and the second internal clock signal ICLK2 has a logic "low" level. The NAND gate NAND11 may generate the inverted latch clock signal LCLKB having a logic "low" level when both of the first internal clock signal ICLK1 and the second internal clock signal ICLK2 have a logic "high" level. The NAND gate NAND12 may receive the first inverted internal clock signal ICLKB1 and the second inverted internal clock signal ICLKB2 and may perform a logical NAND operation of the first inverted internal clock signal ICLKB1 and the second inverted internal clock signal ICLKB2 to generate the latch clock signal LCLK. The NAND gate NAND12 may generate the latch clock signal LCLK having a logic "high" level when at least one of the first inverted internal clock signal ICLKB1 and the second inverted internal clock signal ICLKB2 has a logic "low" level. The NAND gate NAND12 may generate the latch clock signal LCLK having a logic "low" level when both of the first inverted internal clock signal ICLKB1 and the second inverted internal clock signal ICLKB2 have a logic "high" level.

Figure 3:
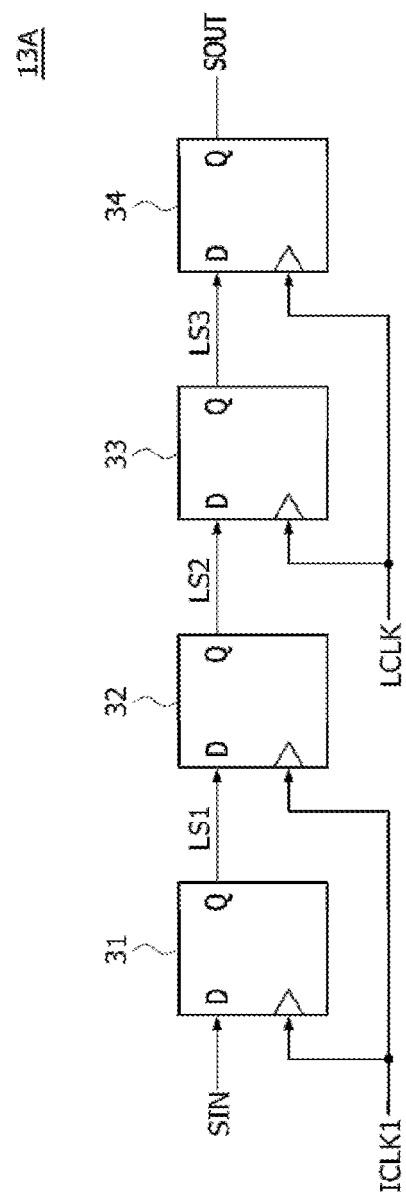
FIG. 3 is a circuit diagram illustrating an example of a clock latch circuit included in the shift register of FIG. 1.

As illustrated in FIG. 3, a clock latch circuit 13A corresponding to an example of the clock latch circuit 13 illustrated in FIG. 1 may include a first clock latch 31, a second clock latch 32, a third clock latch 33, and a fourth clock latch 34. The first clock latch 31 may latch the control signal SIN inputted to an input terminal "D" thereof in synchronization with a rising edge of the first internal clock signal ICLK1 to generate a first latch signal LS1 and may output the first latch signal LS1 through an output terminal "Q" thereof. The rising edge of the first internal clock signal ICLK1 may be defined as a point in time when a logic level transition of the first internal clock signal ICLK1 occurs from a logic "low" level into a logic "high" level. The second clock latch 32 may latch the first latch signal LS1 inputted to an input terminal "D" thereof in synchronization with a rising edge of the first internal clock signal ICLK1 to generate a second latch signal LS2 and may output the second latch signal LS2 through an output terminal "Q" thereof. The third clock latch 33 may latch the second latch signal LS2 inputted to an input terminal "D" thereof in synchronization with a rising edge of the latch clock signal LCLK to generate a third latch signal LS3 and may output the third latch signal LS3 through an output terminal "Q" thereof. The fourth clock latch 34 may latch the third latch signal LS3 inputted to an input terminal "D" thereof in synchronization with a rising edge of the latch clock signal LCLK to generate the shift control signal SOUT and may output the shift control signal SOUT through an output terminal "Q" thereof. Each of the first to fourth clock latches 31, 32, 33, and 34 may be realized using a D-flipflop.

Figure 4:
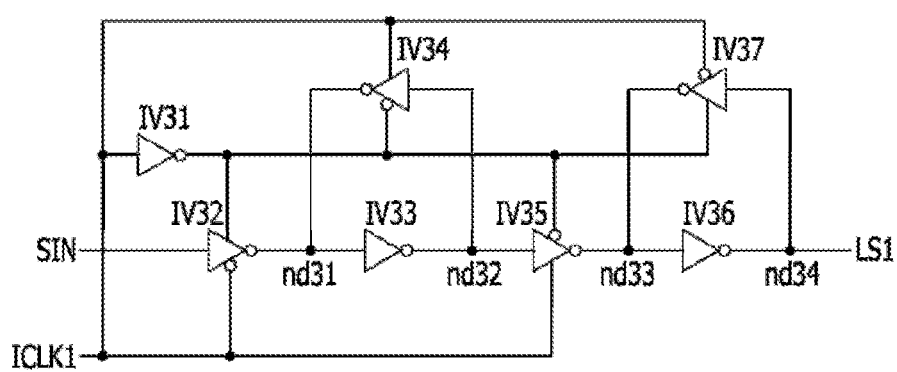
FIG. 4 is a circuit diagram illustrating an example of a first clock latch included in the clock latch circuit of FIG. 3.

As illustrated in FIG. 4, the first clock latch 31 may be configured to perform inversion operations and may include, for example but not limited to, inverters IV31~IV37. The inverter IV31 may inversely buffer the first internal clock signal ICLK1 to output the inversely buffered signal of the first internal clock signal ICLK1. The inverter IV32 may inversely buffer the control signal SIN in synchronization with a falling edge of the first internal clock signal ICLK1 to output the inversely buffered signal of the control signal SIN to a node nd31. The falling edge of the first internal clock signal ICLK1 may be defined as a point in time when a logic level transition of the first internal clock signal ICLK1 occurs from a logic "high" level into a logic "low" level. The inverter IV33 may inversely buffer a signal of the node nd31 to output the inversely buffered signal of the signal of the node nd31 to a node nd32. The inverter IV34 may inversely buffer a signal of the node nd32 in synchronization with a rising edge of the first internal clock signal ICLK1 to output the inversely buffered signal of the signal of the node nd32 to the node nd31. The inverter IV35 may inversely buffer a signal of the node nd32 in synchronization with a rising edge of the first internal clock signal ICLK1 to output the inversely buffered signal of the signal of the node nd32 to a node nd33. The inverter IV36 may inversely buffer a signal of the node nd33 to output the inversely buffered signal of the signal of the node nd33 to a node nd34. The inverter IV37 may inversely buffer a signal of the node nd34 in synchronization with a falling edge of the first internal clock signal ICLK1 to output the inversely buffered signal of the signal of the node nd34 to the node nd33. An output signal of the inverter IV36 may be outputted as the first latch signal LS1 through the node nd34.

Figure 5:
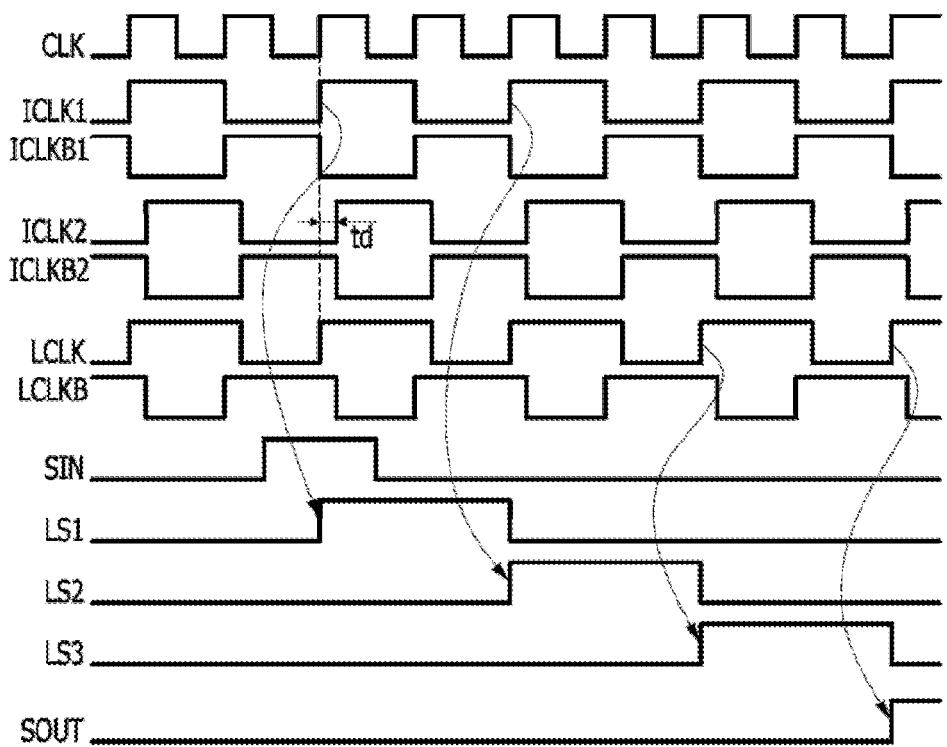
FIG. 5 is a timing diagram illustrating an operation of the clock latch circuit shown in FIG. 3.

An operation of the clock latch circuit 13A will be described hereinafter with reference to FIG. 5 under the assumption that there is a skew of a period "td" between the first internal clock signal ICLK1 (or the first inverted internal clock signal ICLKB1) generated from the clock signal CLK and the second internal clock signal ICLK2 (or the second inverted internal clock signal ICLKB2) generated from the clock signal CLK.

The clock latch circuit 13A may latch the control signal SIN twice in synchronization with a rising edge of the first internal clock signal ICLK1 to sequentially generate the first latch signal LS1 and the second latch signal LS2 and may then latch the second latch signal LS2 twice in synchronization with a rising edge of the latch clock signal LCLK to sequentially generate the third latch signal LS3 and the shift control signal SOUT. The shift control signal SOUT may be generated by shifting the first latch signal LS1 by three cycles of the first internal clock signal ICLK1.

The clock latch circuit 13A may generate the shift control signal SOUT which is stably shifted even though a skew of the period "td" exists between the first internal clock signal ICLK1 and the second internal clock signal ICLK2, by using the latch clock signal LCLK instead of the first and second internal clock signals ICLK1 and ICLK2 when the control signal SIN is sequentially shifted in synchronization with rising edges of the first internal clock signal ICLK1 and the second internal clock signal ICLK2 to generate the shift control signal SOUT. This is because the rising edges of the latch clock signal LCLK occur at the same points in time as the rising edges of the first internal clock signal ICLK1.

Figure 6:
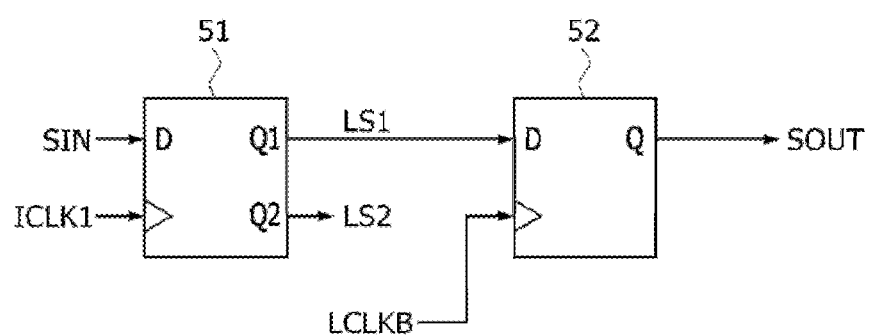
FIG. 6 is a circuit diagram illustrating another example of a clock latch circuit included in the shift register of FIG. 1.

As illustrated in FIG. 6, a clock latch circuit 13B corresponding to another example of the clock latch circuit 13 illustrated in FIG. 1 may include a first clock latch 51 and a second clock latch 52. The first clock latch 51 may latch the control signal SIN in synchronization with the first internal clock signal ICLK1 to generate a first latch signal LS1 and a second latch signal LS2. The first clock latch 51 may latch the control signal SIN inputted to an input terminal "D" thereof in synchronization with a falling edge of the first internal clock signal ICLK1 to generate the first latch signal LS1 and may output the first latch signal LS1 through a first output terminal "Q1" thereof. The first clock latch 51 may latch the control signal SIN inputted to the input terminal "D" thereof in synchronization with a rising edge of the first internal clock signal ICLK1 to generate the second latch signal LS2 and may output the second latch signal LS2 through a second output terminal "Q2" thereof. The second clock latch 52 may latch the first latch signal LS1 inputted to an input terminal "D" thereof in synchronization with a rising edge of the inverted latch clock signal ICLKB to generate the shift control signal SOUT and may output the shift control signal SOUT through an output terminal "Q" thereof. Each of the first and second clock latches 51 and 52 may be realized using a D-flipflop.

Figure 7:
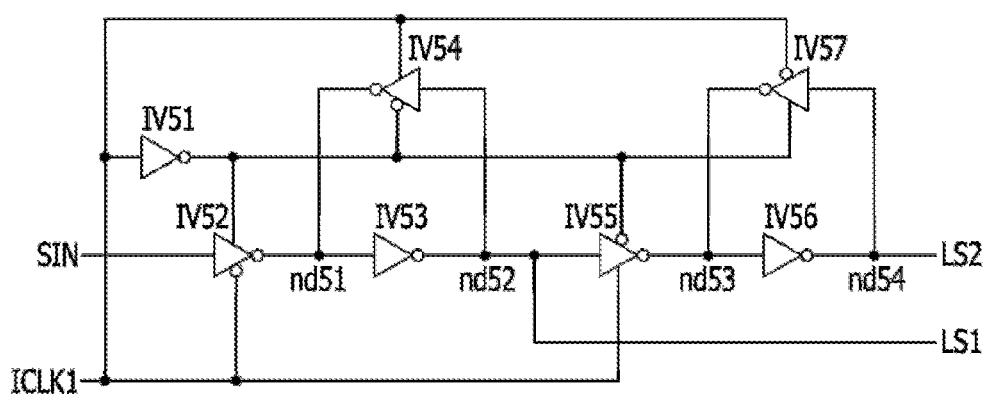
FIG. 7 is a circuit diagram illustrating an example of a first clock latch included in the clock latch circuit of FIG. 6.

As illustrated in FIG. 7, the first clock latch 51 may be configured to perform inversion operations and may include, for example but not limited to, inverters IV51~IV57. The inverter IV51 may inversely buffer the first internal clock signal ICLK1 to output the inversely buffered signal of the first internal clock signal ICLK1. The inverter IV52 may inversely buffer the control signal SIN in synchronization with a falling edge of the first internal clock signal ICLK1 to output the inversely buffered signal of the control signal SIN to a node nd51. The inverter IV53 may inversely buffer a signal of the node nd51 to output the inversely buffered signal of the signal of the node nd51 as the first latch signal LS1 through a node nd52. The inverter IV54 may inversely buffer a signal of the node nd52 in synchronization with a rising edge of the first internal clock signal ICLK1 to output the inversely buffered signal of the signal of the node nd52 to the node nd51. The inverter IV55 may inversely buffer a signal of the node nd52 in synchronization with a rising edge of the first internal clock signal ICLK1 to output the inversely buffered signal of the signal of the node nd52 to a node nd53. The inverter IV56 may inversely buffer a signal of the node nd53 to output the inversely buffered signal of the signal of the node nd53 to a node nd54. The inverter IV57 may inversely buffer a signal of the node nd54 in synchronization with a falling edge of the first internal clock signal ICLK1 to output the inversely buffered signal of the signal of the node nd54 to the node nd53. An output signal of the inverter IV56 may be outputted as the second latch signal LS2 through the node nd54.

Figure 8:
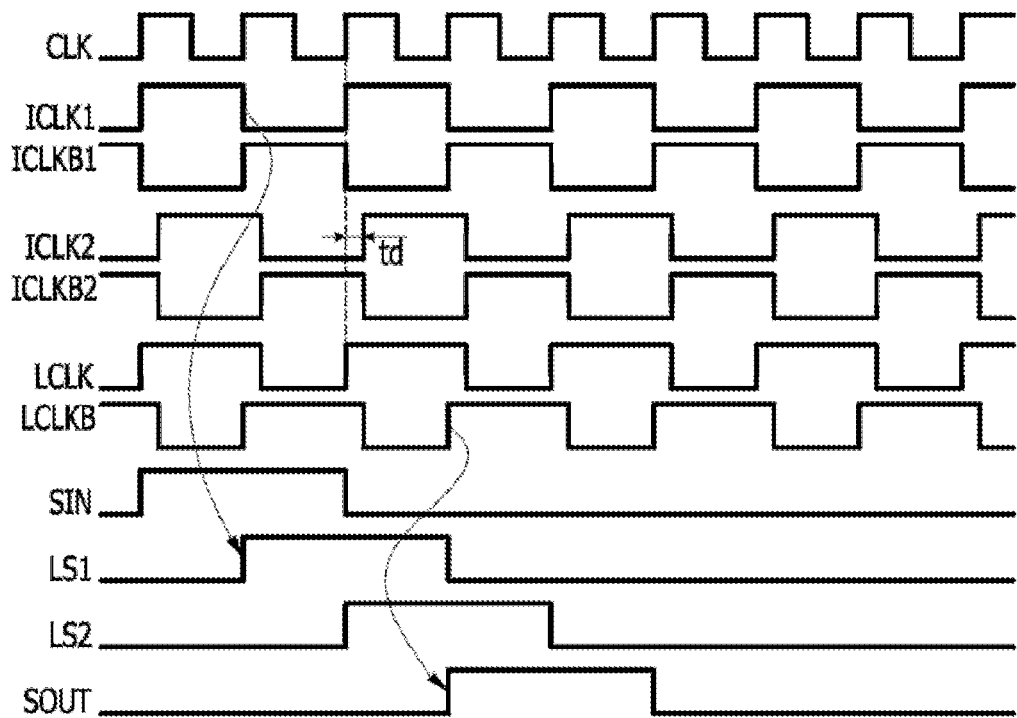
FIG. 8 is a timing diagram illustrating an operation of the clock latch circuit shown in FIG. 6.

An operation of the clock latch circuit 13B will be described hereinafter with reference to FIG. 8 under the assumption that there is a skew of a period "td" between the first internal clock signal ICLK1 (or the first inverted internal clock signal ICLKB1) generated from the clock signal CLK and the second internal clock signal ICLK2 (or the second inverted internal clock signal ICLKB2) generated from the clock signal CLK.

The clock latch circuit 13B may latch the control signal SIN in synchronization with a falling edge of the first internal clock signal ICLK1 to generate the first latch signal LS1 and may then latch the first latch signal LS1 in synchronization with a rising edge of the inverted latch clock signal LCLKB to generate the shift control signal SOUT. The shift control signal SOUT may be generated by sequentially shifting the control signal SIN in synchronization with a falling edge of the first internal clock signal ICLK1 and a rising edge of the inverted latch clock signal LCLKB.

The clock latch circuit 13B may generate the shift control signal SOUT which is stably shifted even though a skew of the period "td" exists between the first internal clock signal ICLK1 and the second internal clock signal ICLK2, by using the inverted latch clock signal LCLKB instead of the second inverted internal clock signal ICLKB2 when the control signal SIN is sequentially shifted in synchronization with a falling edge of the first internal clock signal ICLK1 and a rising edge of the inverted latch clock signal LCLKB to generate the shift control signal SOUT.

Figure 9:
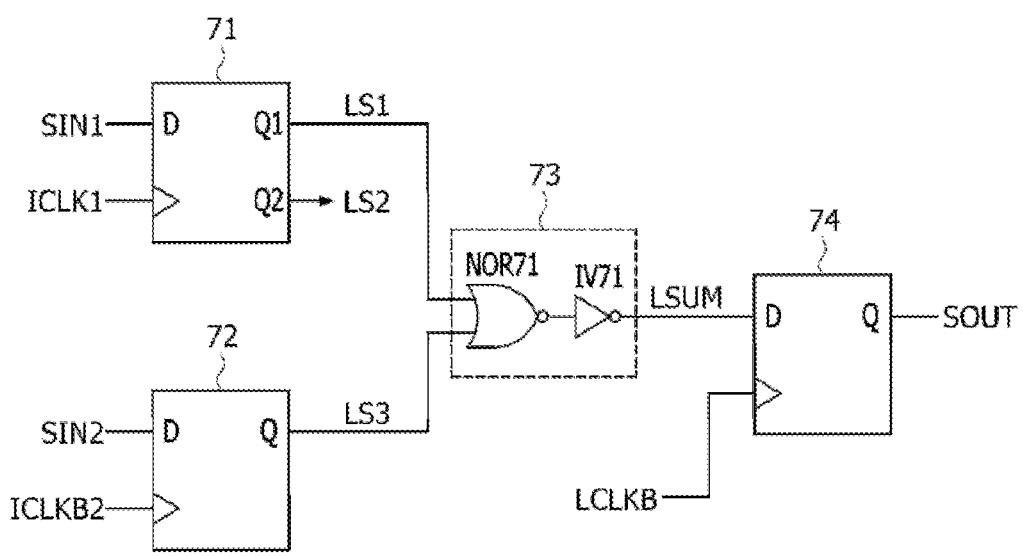
FIG. 9 is a circuit diagram illustrating another example of a clock latch circuit included in the shift register of FIG. 1.

As illustrated in FIG. 9, a clock latch circuit 13C corresponding to another example of the clock latch circuit 13 illustrated in FIG. 1 may include a first clock latch 71, a second clock latch 72, a latch signal synthesis circuit 73, and a third clock latch 74.

The first clock latch 71 may latch a first control signal SIN1 included in the control signal SIN in synchronization with the first internal clock signal ICLK1 to generate a first latch signal LS1 and a second latch signal LS2. The first clock latch 71 may latch the first control signal SIN1 inputted to an input terminal "D" thereof in synchronization with a falling edge of the first internal clock signal ICLK1 to generate the first latch signal LS1 and may output the first latch signal LS1 through a first output terminal "Q1" thereof. The first clock latch 71 may latch the first control signal SIN1 inputted to the input terminal "D" thereof in synchronization with a rising edge of the first internal clock signal ICLK1 to generate the second latch signal LS2 and may output the second latch signal LS2 through a second output terminal "Q2" thereof.

The second clock latch 72 may latch a second control signal SIN2 included in the control signal SIN in synchronization with the second inverted internal clock signal ICLKB2 to generate a third latch signal LS3. The second clock latch 72 may latch the second control signal SIN2 inputted to an input terminal "D" thereof in synchronization with a rising edge of the second inverted internal clock signal ICLKB2 to generate the third latch signal LS3 and may output the third latch signal LS3 through an output terminal "Q" thereof.

The latch signal synthesis circuit 73 may be configured to perform NOR and inversion operations and may include, for example but not limited to, a NOR gate NOR71 and an inverter IV71. The latch signal synthesis circuit 73 may generate the synthesis latch signal LSUM having a logic "high" level when the first latch signal LS1 or the third latch signal LS3 has a logic "high" level.

The third clock latch 74 may latch the synthesis latch signal LSUM inputted to an input terminal "D" thereof in synchronization with a rising edge of the inverted latch clock signal LCLKB to generate the shift control signal SOUT and may output the shift control signal SOUT through an output terminal "Q" thereof. Each of the first, second, and third clock latches 71, 72, and 73 may be realized using a D-flipflop.

Figure 10:
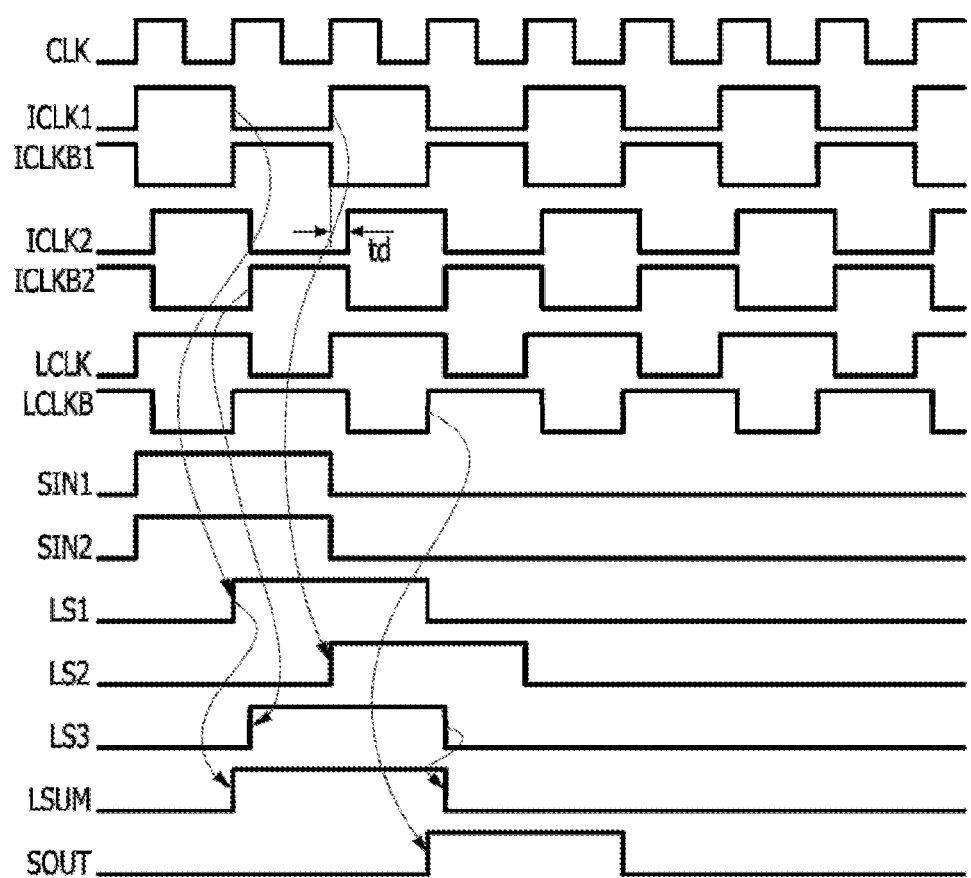
FIG. 10 is a timing diagram illustrating an operation of the clock latch circuit shown in FIG. 9.

An operation of the clock latch circuit 13C will be described hereinafter with reference to FIG. 10 under the assumption that there is a skew of a period "td" between the first internal clock signal ICLK1 (or the first inverted internal clock signal ICLKB1) generated from the clock signal CLK and the second internal clock signal ICLK2 (or the second inverted internal clock signal ICLKB2) generated from the clock signal CLK.

The clock latch circuit 13C may latch the first control signal SIN1 in synchronization with a falling edge of the first internal clock signal ICLK1 to generate the first latch signal LS1 and may then latch the synthesis latch signal LSUM, which is generated from the first latch signal LS1, in synchronization with a rising edge of the inverted latch clock signal LCLKB to generate the shift control signal SOUT.

The shift control signal SOUT may be generated by sequentially shifting the first control signal SIN1 in synchronization with a falling edge of the first internal clock signal ICLK1 and a rising edge of the inverted latch clock signal LCLKB.

The clock latch circuit 13C may latch the second control signal SIN2 in synchronization with a rising edge of the second inverted internal clock signal ICLKB2 to generate the third latch signal LS3 and may then latch the synthesis latch signal LSUM, which is generated from the third latch signal LS3, in synchronization with a rising edge of the inverted latch clock signal LCLKB to generate the shift control signal SOUT. The shift control signal SOUT may be generated by sequentially shifting the second control signal SIN2 in synchronization with a rising edge of the second inverted internal clock signal ICLKB2 and a rising edge of the inverted latch clock signal LCLKB.

According to the embodiments described above, a latch clock signal may be generated from multiphase internal clock signals, and a control signal may be shifted using the multiphase internal clock signals and the latch clock signal. As a result, it may be possible to stably shift the control signal even though a skew occurs between the multiphase internal clock signals.

What is claimed is:

1. A shift register comprising:
   a latch clock generation circuit configured to generate a latch clock signal and an inverted latch clock signal based on a first internal clock signal, a first inverted internal clock signal, a second internal clock signal, and a second inverted internal clock signal; and
   a clock latch circuit configured to latch a control signal in synchronization with one signal selected from the first internal clock signal, the first inverted internal clock signal, the second internal clock signal, and the second inverted internal clock signal and configured to latch the latched control signal in synchronization with the latch clock signal or the inverted latch clock signal to generate and output a shift control signal.

2. The shift register of claim 1,
   wherein the latch clock signal has a second logic level when the first inverted internal clock signal or the second inverted internal clock signal has a first logic level different from the second logic level; and
   wherein the latch clock signal has the first logic level when both of the first inverted internal clock signal and the second inverted internal clock signal have the second logic level.

3. The shift register of claim 1,
wherein the inverted latch clock signal has a second logic level when the first internal clock signal or the second internal clock signal has a first logic level different from the second logic level; and
wherein the inverted latch clock signal has the first logic level when both of the first internal clock signal and the second internal clock signal have the second logic level.

4. The shift register of claim 1, further comprising a first internal clock generation circuit configured to divide a clock signal to generate the first internal clock signal and configured to invert the first internal clock signal to generate the first inverted internal clock signal.

5. The shift register of claim 4, further comprising a second internal clock generation circuit configured to divide the clock signal to generate the second internal clock signal and configured to invert the second internal clock signal to generate the second inverted internal clock signal.

6. The shift register of claim 1, wherein the clock latch circuit is configured to latch the control signal in synchronization with an edge of the first internal clock signal and configured to latch the latched control signal in synchronization with the edge of the latch clock signal to generate the shift control signal.

7. The shift register of claim 6, wherein the edge is set as a point in time when a logic level of the first internal clock signal changes from a logic "low" level into a logic "high" level.

8. The shift register of claim 1, wherein the clock latch circuit includes:
a first clock latch configured to latch the control signal in synchronization with a first edge of the first internal clock signal to generate a first latch signal;
a second clock latch configured to latch the first latch signal in synchronization with another first edge of the first internal clock signal to generate a second latch signal;
a third clock latch configured to latch the second latch signal in synchronization with a first edge of the latch clock signal to generate a third latch signal; and
a fourth clock latch configured to latch the third latch signal in synchronization with another first edge of the latch clock signal to generate the shift control signal.

9. The shift register of claim 1, wherein the clock latch circuit is configured to latch the control signal in synchronization with an edge of the first internal clock signal and configured to latch the latched control signal in synchronization with an edge of the inverted latch clock signal to generate the shift control signal.

10. The shift register of claim 9,
wherein the edge of the first internal clock signal is set as a point in time when a logic level of the first internal clock signal changes from a logic "high" level into a logic "low" level; and
wherein the edge of the inverted latch clock signal is set as a point in time when a logic level of the inverted latch clock signal changes from a logic "low" level into a logic "high" level.

11. The shift register of claim 1,
wherein the control signal includes a first control signal and a second control signal; and
wherein the clock latch circuit includes:
a first clock latch configured to latch the first control signal in synchronization with a second edge of the first internal clock signal to generate a first latch signal;
a second clock latch configured to latch the second control signal in synchronization with a first edge of the second inverted internal clock signal to generate a third latch signal;
a latch signal synthesis circuit configured to synthesize the first latch signal and the third latch signal to generate a synthesis latch signal; and
a third clock latch configured to latch the synthesis latch signal in synchronization with the first edge of the inverted latch clock signal to generate the shift control signal.

12. A shift register comprising:
a latch clock generation circuit configured to generate a latch clock signal and an inverted latch clock signal based on a first internal clock signal, a first inverted internal clock signal, a second internal clock signal, and a second inverted internal clock signal;
a first clock latch configured to be synchronized with an edge of the first internal clock signal to latch a control signal; and
a second clock latch configured to latch an output signal of the first clock latch in synchronization with an edge of the latch clock signal to generate a shift control signal.

13. The shift register of claim 12,
wherein the latch clock signal has a second logic level when the first inverted internal clock signal or the second inverted internal clock signal has a first logic level different from the second logic level; and
wherein the latch clock signal has the first logic level when both of the first inverted internal clock signal and the second inverted internal clock signal have the second logic level.

14. The shift register of claim 12,
wherein the inverted latch clock signal has a second logic level when the first internal clock signal or the second internal clock signal has a first logic level different from the second logic level; and
wherein the inverted latch clock signal has the first logic level when both of the first internal clock signal and the second internal clock signal have the second logic level.

15. The shift register of claim 12, further comprising a first internal clock generation circuit configured to divide a clock signal to generate the first internal clock signal and configured to invert the first internal clock signal to generate the first inverted internal clock signal.

16. The shift register of claim 15, further comprising a second internal clock generation circuit configured to divide the clock signal to generate the second internal clock signal and configured to invert the second internal clock signal to generate the second inverted internal clock signal.

17. The shift register of claim 12, wherein the edge is set as a point in time when a logic level of the first internal clock signal changes from a logic "low" level into a logic "high" level.

18. A shift register comprising:
a latch clock generation circuit configured to generate a latch clock signal and an inverted latch clock signal based on a first internal clock signal, a first inverted internal clock signal, a second internal clock signal, and a second inverted internal clock signal;
a first clock latch configured to be synchronized with an edge of the first internal clock signal to latch a control signal; and a second clock latch configured to latch an output signal of the first clock latch in synchronization with an edge of the inverted latch clock signal to generate a shift control signal.

19. The shift register of claim 18,
wherein the inverted latch clock signal has a second logic level when the first internal clock signal or the second internal clock signal has a first logic level different from the second logic level; and
wherein the inverted latch clock signal has the first logic level when both of the first internal clock signal and the second internal clock signal have the second logic level.

20. The shift register of claim 18,
wherein the edge of the first internal clock signal is set as a point in time when a logic level of the first internal clock signal changes from a logic "high" level into a logic "low" level; and
wherein the edge of the inverted latch clock signal is set as a point in time when a logic level of the inverted latch clock signal changes from a logic "low" level into a logic "high" level.

* * * * *